US008198709B2

(12) United States Patent
Chou et al.

(10) Patent No.: US 8,198,709 B2
(45) Date of Patent: Jun. 12, 2012

(54) POTTED INTEGRATED CIRCUIT DEVICE WITH ALUMINUM CASE

(75) Inventors: Peter Chou, Taipei (TW); Lucy Tian, Tianjin (CN); Ivan Fu, Tianjin (CN); Samuel Li, Tianjin (CN); May-Luen Chou, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 437 days.

(21) Appl. No.: 11/582,699

(22) Filed: Oct. 18, 2006

(65) Prior Publication Data

US 2008/0093735 A1   Apr. 24, 2008

(51) Int. Cl.
*H01L 23/34*   (2006.01)

(52) U.S. Cl. ........ 257/659; 257/699; 257/708; 257/724; 257/E23.044; 257/E23.114; 361/769; 361/789; 438/121

(58) Field of Classification Search .................. 257/724, 257/E23.044, E23.14, 699, 659, E23.114, 257/708; 361/769, 789; 438/121
See application file for complete search history.

(56) References Cited

U.S. PATENT DOCUMENTS

| | | | | |
|---|---|---|---|---|
| 2,903,630 A * | 9/1959 | Cohen et al. | ................... | 257/659 |
| 2,981,875 A * | 4/1961 | Kelley et al. | ................... | 257/773 |
| 3,255,394 A * | 6/1966 | Lake | ............................... | 257/47 |
| 3,271,638 A * | 9/1966 | Murad | .......................... | 257/660 |
| RE28,145 E * | 9/1974 | Tharman | ....................... | 363/146 |
| 4,314,270 A * | 2/1982 | Iwatani | .......................... | 257/708 |
| 4,766,479 A * | 8/1988 | Krum et al. | .................... | 257/737 |
| 5,001,299 A * | 3/1991 | Hingorany | .................... | 174/521 |
| 5,052,005 A * | 9/1991 | Tanaka et al. | ................... | 372/36 |
| 6,341,413 B1 * | 1/2002 | Shimizu et al. | ............... | 29/602.1 |
| 6,402,347 B1 * | 6/2002 | Maas et al. | ..................... | 362/294 |
| 6,710,463 B2 | 3/2004 | Choi | | |
| 2003/0213979 A1 * | 11/2003 | Nakajima et al. | ............. | 257/200 |
| 2005/0073018 A1 * | 4/2005 | Yano et al. | ..................... | 257/433 |
| 2006/0091512 A1 * | 5/2006 | Shinohara | ...................... | 257/678 |

OTHER PUBLICATIONS

Vishay General Semiconductor; GBPC12, 15, 25, and 35—Glass Passivated Single-Phase Bridge Rectifier; Jun. 6, 2006, pp. 1-6; downloaded from the internet www.vishay.com.
STMicroelectronics; STPS745D/F/G/FP—Power Schottky Rectifier; 2003, pp. 1-7; Printed in Italy.
IOR International Rectifier; 12CGQ150—Schottky Rectifier High Efficiency Series; pp. 1-4; exact date unknown; downloaded from the internet on Feb. 20, 2006 www.irf.com.

(Continued)

*Primary Examiner* — Eugene Lee
*Assistant Examiner* — Peniel M Gumedzoe
(74) *Attorney, Agent, or Firm* — Mayer & Williams PC; Karin L. Williams; Stuart H. Mayer

(57) ABSTRACT

An integrated circuit device includes a die, a lead, and an electrically-conductive structure that is arranged to facilitate electrical communication between the die and the lead. The device also includes a potting material, in which the electrically conductive structure, the die, and at least part of the lead are embedded. An electrically-conductive housing encases the potting material and forms exterior packaging of the device. During manufacturing, the electrically-conductive structure, the die, and at least part of the lead may be arranged within the electrically-conductive housing either before or after the potting material is disposed in the housing. When the integrated circuit device is operating, heat is removable from the die via a thermal conduction path formed by the electrically-conductive structure, the potting material, and the electrically-conductive housing.

15 Claims, 4 Drawing Sheets

OTHER PUBLICATIONS

Microsemi Corp. Watertown the diode experts; Rectifier Assemblies Three Phase Bridges, 25 Amp, Military Approved; pp. 3-14 and 3-15; exact date unknown, but prior to filing date of the instant application; down loaded from the internet www.datasheetcatalog.com, Oct. 18, 2006.

STMicroelectronics; STTH8R06—Turbo 2 Ultrafast High Voltage Rectifier; Dec. 2004; pp. 1-9.

Fairchild Semiconductor; IC Package, 3-lead TO-220 Specification, 2006 Copyright, but prior to filing date of the instant application.

* cited by examiner ns of leads.

POTTED INTEGRATED CIRCUIT DEVICE WITH ALUMINUM CASE

BACKGROUND

One cause of reduced efficiency in integrated circuit devices such as rectifiers is inadequate cooling during normal operation. FIG. 1 is a perspective view of one package option for a Vishay® Semiconductor brand dual high-voltage rectifier device 10 having two semiconductor dies (not visible) inside, manufactured by Vishay Intertechnology, Inc. Device 10 is through-hole mountable via leads 14 (although surface-mountable packaging options are available), and includes an exterior epoxy housing 12 and an aluminum-composite heat sink 16. Heat sink 16 may form one side of housing 12, or be attached thereto. During operation of device 10, heat generated by the dies is transferred through leads 14, housing 12, and heat sink 16. The thermal conductivity of housing 12 is generally significantly less than that of heat sink 16, however, which may result in areas of device 10 having unsatisfactory thermal dissipation performance.

There are needs for integrated circuit devices, such as semiconductor devices, with package designs incorporating lightweight, electrically-isolated heat sinks that can be used in both surface-mountable and through-hole-mountable applications to satisfactorily dissipate heat from multiple surfaces of a device, including the housing thereof.

It will be appreciated that the claimed subject matter is not limited to implementations that solve any or all of the disadvantages of specific integrated circuit device packaging designs or aspects thereof.

SUMMARY

Aspects of surface- and through-hole-mountable integrated circuits, such as bridge rectifier devices, are discussed herein. In particular, integrated circuit devices, and methods for manufacturing such integrated circuit devices, are disclosed. In one implementation, an integrated circuit device (a rectifier, for example) includes a die, a lead, and an electrically-conductive structure (such as a copper die pad) arranged to facilitate electrical communication between the die and the lead. The device also includes a potting material, in which the electrically conductive structure, the die, and at least part of the lead are embedded. An electrically-conductive housing (such as an aluminum composite housing) encases the potting material and forms exterior packaging of the device. During manufacturing, the electrically-conductive structure, the die, and at least part of the lead may be arranged within the electrically-conductive housing either before or after the potting material is disposed in the housing.

When the integrated circuit device is operating, heat is removable from the die via a thermal conduction path formed by the electrically-conductive structure, the potting material, and the electrically-conductive housing.

This Summary is provided to introduce a selection of concepts in simplified form. The concepts are further described in the Detailed Description section. Elements or steps other than those described in this Summary are possible, and no element or step is necessarily required. This Summary is not intended to identify key features or essential features of the claimed subject matter, nor is it intended for use as an aid in determining the scope of the claimed subject matter.

DETAILED DESCRIPTION

Figure 1:
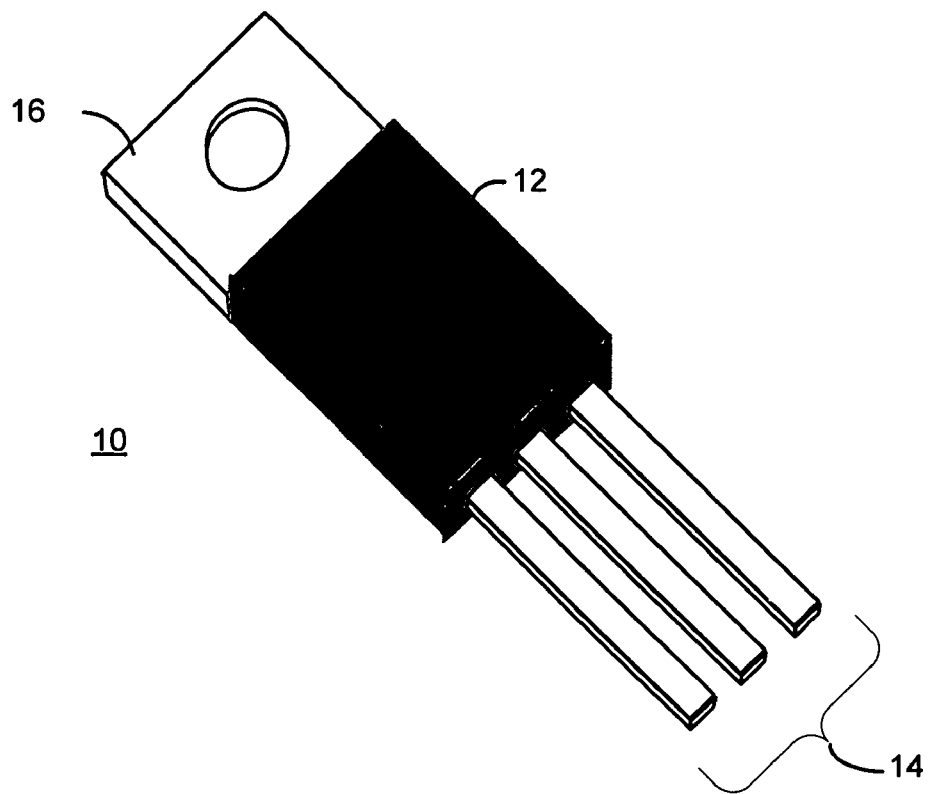
FIG. 1 is a perspective view of general packaging for a through-hole-mountable integrated circuit device.
Figure 2:
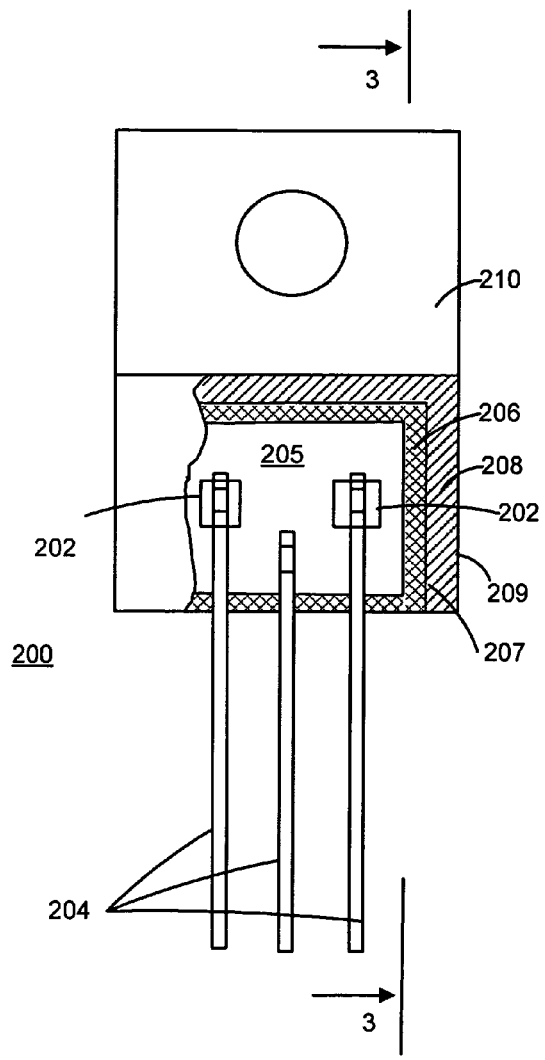
FIG. 2 is a plan view of an interior cross-section of an exemplary integrated circuit device having a thermally-conductive housing forming the exterior packaging thereof.

Turning to the drawings, where like numerals designate like components, FIG. 2 is a plan view of an interior cross-section of an exemplary integrated circuit device 200 (referred to for discussion purposes as a power rectifier). Elements of device 200 are briefly introduced, and the elements are discussed in further detail below.

Device 200 includes two dies 202; three leads 204; an electrically-conductive structure 205, which is arranged to facilitate electrical communication between one or more dies 202 and one or more leads 204; potting material 206, in which electrically-conductive structure 205, dies 202, and portions of leads 204 are embedded; and an electrically-conductive housing 208, which encases potting material 206 and forms exterior packaging of device 200. Housing 208 has an interior surface 207 and an exterior surface 209. Structure 210, which may be composed of the same or different material as the interior and/or exterior surfaces of electrically-conductive housing 208, extends from housing 208 and provides additional heat removal capability (discussed further below, in connection with FIG. 5) during normal operation of device 200.

Dies 202 are similar to those found within commercially available analog or digital integrated circuit chips. As such, dies 202 are generally composed of a base material, such as a semiconductor material, and at least two electrodes (not shown), which are conductors used to make electrical contact with one or more circuits on the dies that perform predetermined functions (signal rectification, for example).

Leads 204 facilitate electrical interconnection between electronic components external to device 200 and the electrodes of dies 202. Leads 204 are generally composed in whole or in part of a conductive material such as copper. As shown, portions of leads 204 extending external to device 200 are configured to allow device 200 to be mounted to a substrate (not shown) using through-hole-mounting techniques, to facilitate electrical interconnection with electronic components external to device 200. It will be appreciated, however, that leads 204 may be alternately configured to allow device 200 to be mounted to a substrate using other mounting techniques, such as surface-mounting techniques.

Inside device 200, a portion of each lead 204 is electrically interconnected to the electrode(s) of a die 202, either directly or indirectly, via electrically-conductive structure 205. As shown, electrically-conductive structure 205 is a rectangular, copper die pad. In general, however, electrically-conductive structure 205 may be any now-known or later-developed structure, in any geometric shape, which is composed in whole or in part of a conductive material. Examples of such structures include die pads, solder balls, lead frames, or portions of leads.

Figure 3:
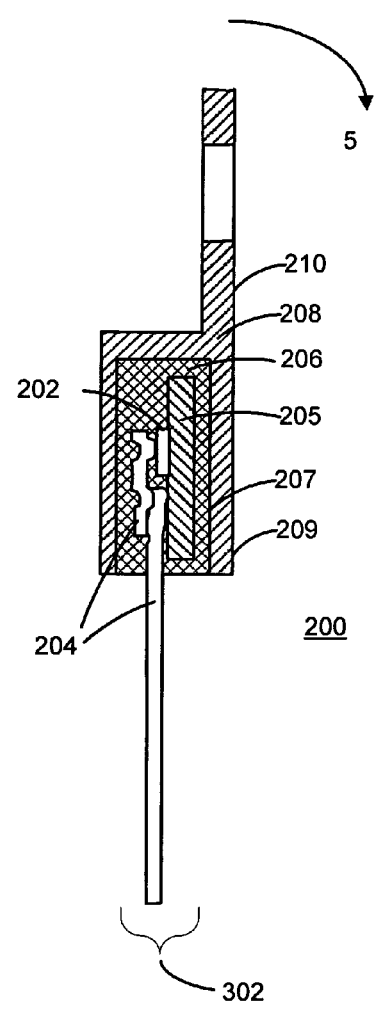
FIG. 3 is a cross-sectional side view, in the direction of arrows 3-3, of the integrated circuit device shown in FIG. 2.

FIG. 3 is a cross-sectional side view of device 200 in the direction of arrows 3-3, illustrating an exemplary arrangement of electrically-conductive structure 205 that facilitates electrical communication between die(s) 202 and the portions of leads 204 inside device 200. One die 202 and two leads 204 are visible in FIG. 3. One side of die 202 faces electrically-conductive structure 205, and another side of die 202 faces lead 204. Electrode(s) on die 202 make contact with lead 204 and electrically-conductive structure 205. Another lead 204 makes contact with the same side of electrically-conductive structure 205 that the side of die 202 faces. Although one electrically-conductive structure 205 is shown, it will be appreciated that more than one such structure may be present.

With continuing reference to FIGS. 2 and 3, in one implementation, one or more die(s) 202, lead(s) 204, and electrically-conductive structure(s) 205 may be arranged to form a sub-assembly 302 (shown in FIG. 3). Sub-assembly 302 is arranged within interior surface 207 of electrically-conductive housing 208, which defines a cavity. Sub-assembly 302 is arranged in such a manner that space exists between it and interior surface 307 of electrically-conductive housing 208. Sub-assembly 302 may be arranged in the cavity defined by interior surface 307 either before or after potting material 206 is disposed therein. Potting material 206 is any suitable dielectric, thermally conductive material now known or later developed, such as epoxy.

Exterior surface 209 of electrically-conductive housing 208 is composed of the same or different material and/or geometry than interior surface 307. As shown, both the interior and exterior surfaces are formed by an aluminum composite material, and have rectangular geometries. Optional structure 210, which extends the heat removal capacity of device 200, is integral with and extends from electrically-conductive housing 208.

Figure 4:
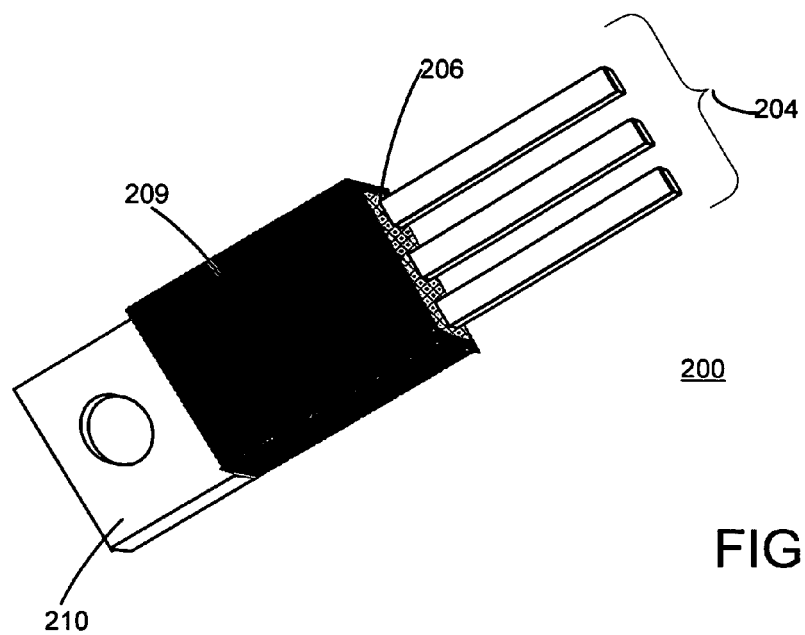
FIG. 4 is a perspective view of the integrated circuit device shown in FIGS. 2 and 3.

FIG. 4 is a perspective view of integrated circuit device 200. As shown, exterior surface 209 of electrically-conductive housing 208 forms five sides (only three sides are visible) of the exterior packaging of device 200, along with optional structure 210. The sixth side includes potting material 206 and portions of leads 204 that extend from device 200.

Figure 5:
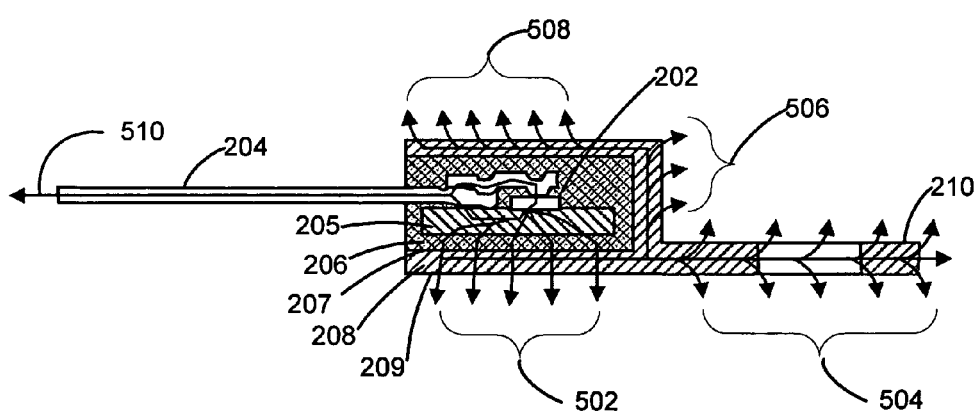
FIG. 5 is a diagram illustrating certain thermal conduction paths through which heat is removed from the integrated circuit device shown in FIGS. 2-4 (which has been rotated 90 degrees in the direction of arrow 5, shown in FIG. 3) during normal operation of the integrated circuit device.
Figure 6:
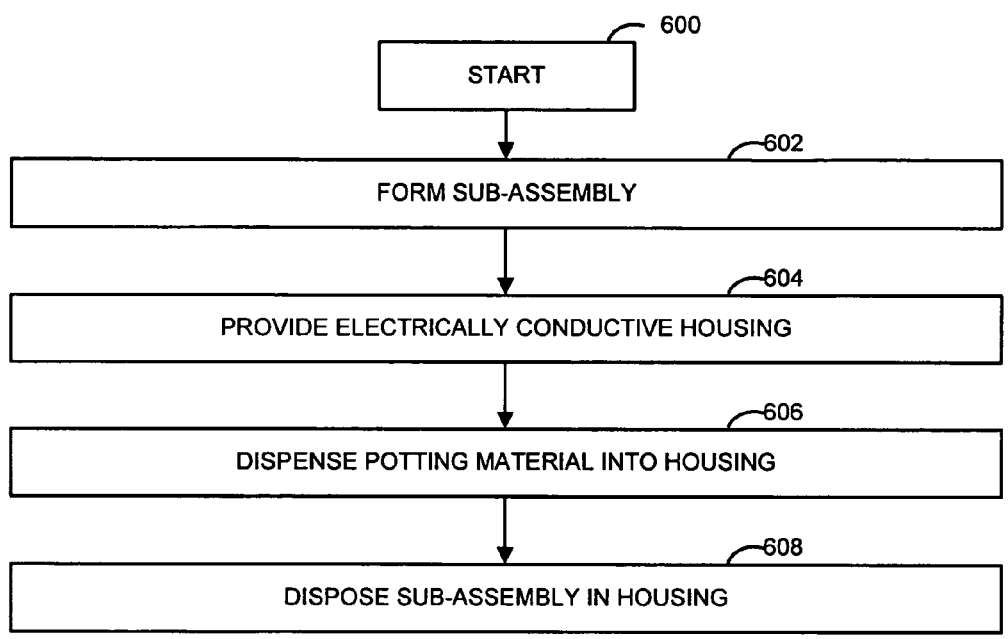
FIG. 6 is a flowchart of a method for manufacturing the integrated circuit device shown in FIGS. 2-4.

FIG. 5 is a diagram illustrating certain thermal conduction paths through which heat is removed from integrated circuit device 200, which has been rotated 90 degrees in the direction of arrow 5, shown in FIG. 3. When device 200 is in normal operation, heat is removed to the ambient environment from die 202 via thermal conduction paths (depicted by arrows 502, 506, and 508) formed by electrically-conductive structure 205, potting material 206, and interior and exterior surfaces 207, 209 of housing 208. Heat is also transferred from dies 202 along a thermal conduction path (depicted by arrows 504) that includes optional structure 210, and a thermal conduction path (depicted by arrows 510) that includes leads 204.

With continued reference to FIGS. 1-5, FIG. 6 is a flowchart of a method for manufacturing an integrated circuit device, such as integrated circuit device 200 shown in FIGS. 2 through 4. The process(es) illustrated in FIG. 6 may be implemented (in whole or in part) using one or more general, multi-purpose, or single-purpose processors. Unless specifically stated, the methods described herein are not constrained to a particular order or sequence. In addition, some of the described method(s) or elements thereof can occur or be performed concurrently.

The method begins at oval 600, and continues at block 602, where a sub-assembly is formed. Sub-assembly 302 (shown in FIG. 3) is an exemplary sub-assembly, which includes electrically-conductive structure 205 that is arranged to facilitate electrical communication between one or more dies 202 and one or more leads 204. In one implementation, electrically-conductive structure 205 may be soldered to one or more dies 202 and one or more leads 204.

Next, at block 704, an electrically-conductive housing, such as housing 208 (shown in FIGS. 2-4), is provided. The electrically-conductive housing has an interior surface defining a cavity, such as interior surface 207, and an exterior surface, such as exterior surface 209. In one implementation, housing 208 is a rectangular, aluminum-composite case.

At block 606, a potting material, such as potting material 206 (shown in FIGS. 2-4) is dispensed into the cavity defined by the interior surface. In one implementation, potting material 206 is an epoxy.

The sub-assembly is disposed in the cavity, at block 608, in such a manner that space exists between the sub-assembly and the interior surface of the electrically-conductive housing. The space is occupied by the potting material. Sub-assembly 302 may be arranged in the cavity defined by interior surface 307 either before or after potting material 206 is disposed therein. Potting material may be self-curing or may be cured in a separate step (not shown).

Integrated circuit devices, and manufacturing method(s) therefor have been described herein. Lightweight, inexpensive, electrically isolated, external device packaging provides significant thermal conduction paths. Generally, using a potting compound instead of another substance (such as an inert gas) gives better thermal properties. The device(s) may be mounted directly to other heat sinks without the need for electrical isolation, so that cooling via the external packaging itself may be used alone, or to supplement cooling provided for larger areas. The integrated circuit device(s) may operate at more desirable temperatures without significant alterations in packaging footprints, and/or without additional isolation requirements, reducing the need for product re-designs. The device(s) may be through-hole mountable or surface-mountable.

Although the subject matter herein has been described in language specific to structural features and/or methodological acts, it is also to be understood that the subject matter defined in the claims is not necessarily limited to the specific features or acts described above. Rather, the specific features and acts described above are disclosed as example forms of implementing the claims. For example, integrated circuit device 200 is referred to as a power rectifier, and is described as having a specific geometry, but any analog or digital integrated circuit device of any geometrical configuration may benefit from the packaging described herein.

The word "exemplary" is used herein to mean serving as an example, instance, or illustration. Any implementation or aspect thereof described herein as "exemplary" is not necessarily to be construed as preferred or advantageous over other implementations or aspects thereof.

As it is understood that embodiments other than the specific embodiments described above may be devised without departing from the spirit and scope of the appended claims, it is intended that the scope of the subject matter herein will be governed by the following claims.

The invention claimed is:

1. An integrated circuit device, comprising:
   a die;
   a first lead and a second lead;
   an electrically-conductive structure, distinct from said first lead and said second lead, wherein said die has two opposing sides, wherein one side of said die faces said electrically-conductive structure and the other side of said die contacts said first lead, and wherein said second lead makes direct contact with said first lead and also with a same side of said electrically-conductive structure as said die faces;

a potting material having the electrically conductive structure, the die, the first lead and at least part of the second lead embedded therein, wherein said die rests on said electrically-conductive structure embedded in said potting material; and an electrically-conductive housing encasing only the potting material, together with the electrically conductive structure, the die, the first lead and at least part of the second lead embedded therein, and arranged to form exterior packaging of the integrated circuit device, wherein heat is removable from the die via a thermal conduction path formed by the electrically-conductive structure, the potting material, and the electrically-conductive housing.

2. The integrated circuit device according to claim 1, wherein the electrically-conductive housing encases a majority of a surface area of the potting material.

3. The integrated circuit device according to claim 1, wherein the die comprises a semiconductor die.

4. The integrated circuit device according to claim 1, wherein the integrated circuit device comprises a rectifier.

5. The integrated circuit device according to claim 1, wherein the integrated circuit device comprises one of a surface-mountable device and a through-hole-mountable device.

6. The integrated circuit device according to claim 1, wherein the integrated circuit device comprises an active device.

7. The integrated circuit device according to claim 1, wherein the electrically-conductive structure comprises one of a copper pad, a solder ball, a lead, and a lead frame.

8. The integrated circuit device according to claim 1, wherein the potting material comprises a dielectric thermally-conductive material.

9. The integrated circuit device according to claim 8, wherein the potting material comprises epoxy.

10. The integrated circuit device according to claim 1, wherein the electrically-conductive housing comprises a metal case.

11. The integrated circuit device according to claim 10, wherein the metal case comprises an aluminum composite case.

12. The integrated circuit device according to claim 1, further comprising: a structure integral with and extending from the electrically-conductive housing, wherein heat is removable from the integrated circuit device via a thermal conduction path formed by the structure.

13. An integrated circuit device, comprising:
an electrically-conductive housing having an interior surface and an exterior surface, the interior surface defining a cavity;
a sub-assembly arranged in the cavity in such a manner that space exists between the sub-assembly and the interior surface, the sub-assembly comprising
a die,
a first lead and a second lead;
an electrically-conductive structure, distinct from said first lead and said second lead, wherein said die has two opposing sides, wherein one side of said die faces said electrically-conductive structure and the other side of said die contacts said first lead, and wherein said second lead makes direct contact with said first lead and also with a same side of said electrically-conductive structure as said die faces; and
a potting material disposed in the space between the sub-assembly and the interior surface, wherein said die rests on said electrically-conductive structure embedded in said potting material, and
wherein said electrically-conductive housing encases only the potting material, the electrically conductive structure, the die, the first lead and at least part of the second lead embedded therein, and is arranged to form exterior packaging of the integrated circuit device.

14. The integrated circuit device according to claim 13, wherein heat is removable from the die through the exterior surface of the electrically-conductive housing via a thermal conduction path formed by the electrically-conductive structure, the potting material, the interior surface of the electrically-conductive housing, and the exterior surface of the electrically-conductive housing.

15. The integrated circuit device according to claim 1, wherein a portion of said lead extends from one exterior side of said electrically conductive housing, and wherein said potting material is exposed at the one exterior side of said electrically conductive housing from which said lead extends.

* * * * *